United States Patent [19]

Goss

[11] 4,249,130

[45] Feb. 3, 1981

[54] DWELL MEASURING APPARATUS

[75] Inventor: Clinton G. Goss, Palatine, Ill.

[73] Assignee: Sun Electric Corporation, Crystal Lake, Ill.

[21] Appl. No.: 960,189

[22] Filed: Nov. 13, 1978

[51] Int. Cl.³ ............................................. G01R 29/00
[52] U.S. Cl. .................................... 324/386; 324/392
[58] Field of Search .................. 324/16 T, 169, 16 R, 324/385, 386, 391, 392

[56] References Cited

U.S. PATENT DOCUMENTS 4,092,584  5/1978  Karlin ............................... 324/16 R

OTHER PUBLICATIONS

Wong, S. K., "VOM with Calibration Circuit . . . ", Electronics, Sep. 18, 1975, pp. 111-112.

*Primary Examiner*—Ernest F. Karlsen
*Attorney, Agent, or Firm*—Allegretti, Newitt, Witcoff & McAndrews

[57] ABSTRACT

A circuit for measuring the dwell angle of an engine ignition system having contact points which close to conduct current through a coil, i.e., dwell, and which open to generate an ignition signal. The primary ignition signal is monitored and shaped to form an output voltage level for comparison against a reference voltage level of a selected percentage of car battery voltage. During the time of dwell, the ignition signal's output voltage level is less than the reference voltage level causing a voltage comparator circuit to direct a relatively constant and independent current to a meter for visual display of the dwell time in terms of dwell angle. The extent of dwell angle displayed is determined by the ratio of the time period over which current is delivered to the metering circuit to the total time between spark plug firings, properly calibrated for the type of engine being tested.

2 Claims, 2 Drawing Figures

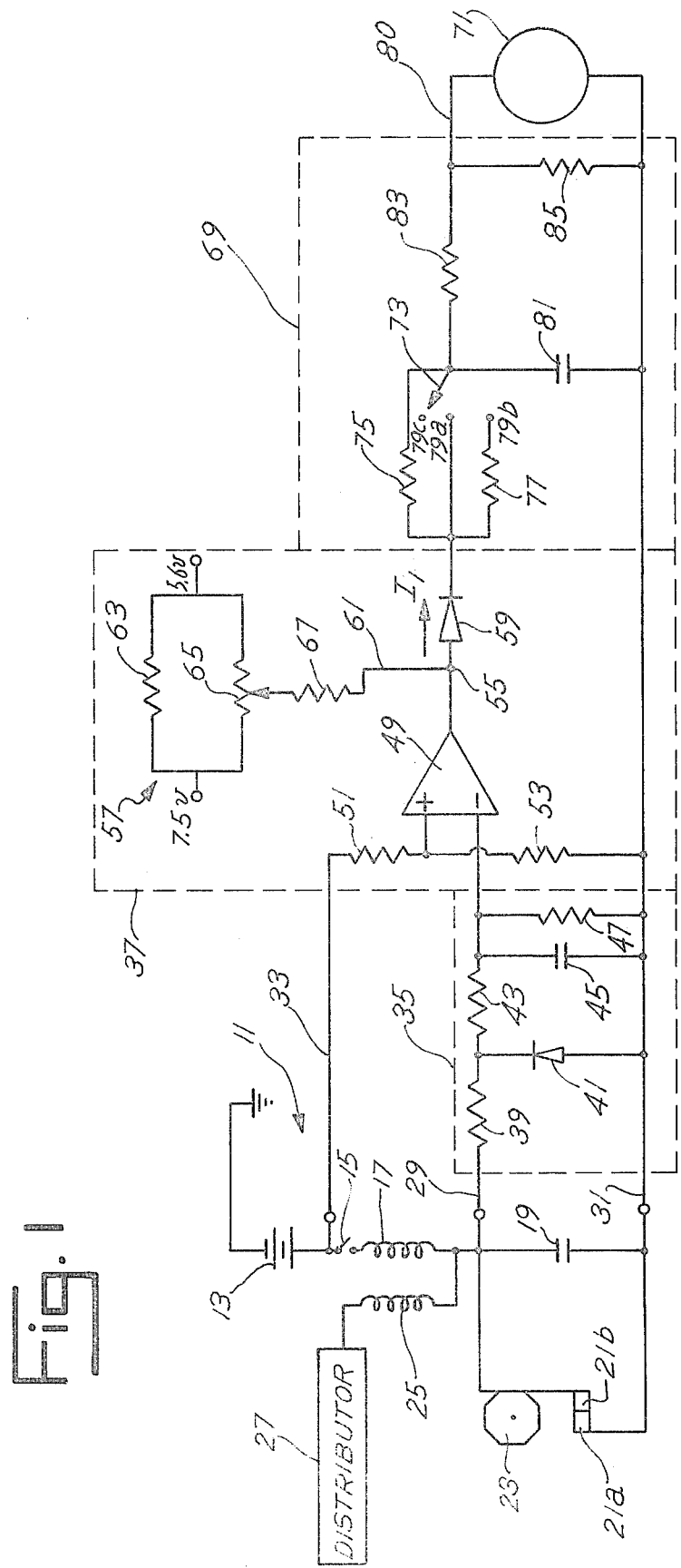

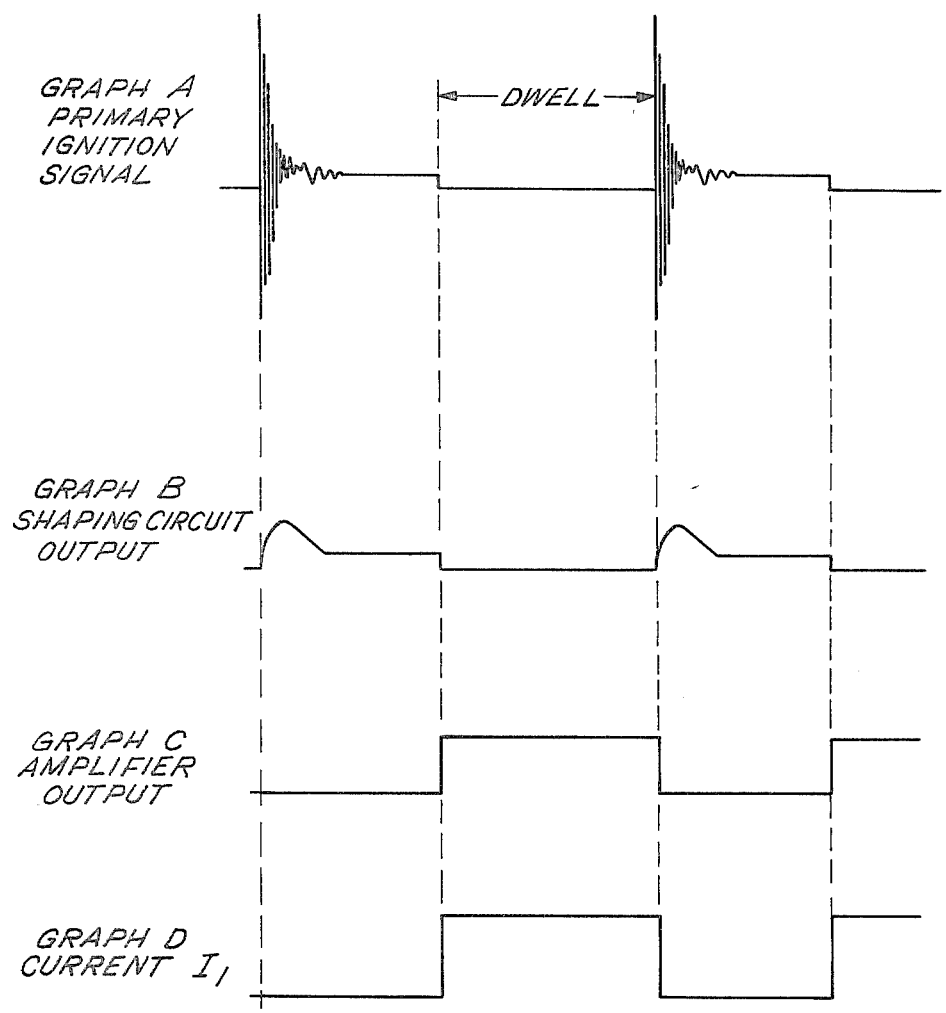

DWELL MEASURING APPARATUS

BACKGROUND OF THE INVENTION

The invention relates to measuring apparatus for engine ignition systems and more particularly relates to apparatus for measuring the dwell angle of an ignition system.

Dwell measuring apparatus includes electrical circuitry composed of a plurality of electrical components interconnected for producing a desired dwell measurement function. For example, U.S. Pat. No. 4,092,584, issued to Richard A. Karlin, on May 30, 1978, and assigned to the same assignee as the present invention, discloses a dwell measuring apparatus in which resistors, diodes, an inductor, a capacitor and a transistor, are inter-connected to provide an output signal to a dwell meter for indicating the dwell angle of an automotive engine ignition system.

Due to manufacturing and cost requirements, electrical components are made within certain tolerance ranges, and therefore, electrical apparatus will include several potentiometers (variable resistors) which are manually tuned to calibrate the electrical apparatus during manufacture thereof.

However, potentiometers are relatively expensive, as is the labor in tuning each potentiometer. In dwell measurement circuitries having the capability of testing more than one cylinder-type engine, for example, 4 cylinder, 6 cylinder and 8 cylinder engines, usually three potentiometers are required, one for each engine type. Thus, it would be highly desirable to devise an electrical dwell measuring circuitry capable of measuring the three most popular cylinder-type engines while needing only one calibration potentiometer.

Further, it would be desirable if such a dwell measurement circuitry would not depend on a points-closed signal of zero volts. That is, many prior art measuring circuits are based on the principle that when the points are closed, the ignition signal is zero. However, with the advent of modern semiconductor components to perform the switching function, a non-zero points-closed voltage occurs in some of the new semiconductor ignition systems, as for example, General Motors Corporation High Energy Ignition System.

SUMMARY OF THE INVENTION

It is therefore an object of the present invention to provide a dwell meter having the capability of measuring the dwell angle of a plurality of different cylinder-type engines, while utilizing a single potentiometer for calibration of the meter.

It is another object of the present invention to provide a novel dwell meter which does not depend on a points-closed signal of zero volts, in order to function properly.

The present invention is a dwell meter in which the time lapse during a points-closed condition as indicated by the primary ignition signal causes an electrical signal, formed independent of the ignition signal, to flow in relation to the time of point closure. The time length of flow of the independent electrical signal serves to drive a visual output device to its proper reading.

By providing a dwell meter which utilizes a signal formed independent of but in time relation to the ignition signal for calculating the dwell angle, various advantages follow including accomplishment of the specific foregoing objects and possibly others advantages which will suggest themselves to persons skilled in the art.

It is therefore an object of the present invention to provide a novel dwell meter which utilizes an electrical signal formed independent of the ignition signal to measure the dwell angle by relating the independently formed signal to the time of point closure as indicated by the primary ignition.

BRIEF DESCRIPTION OF THE DRAWINGS

FIG. 1 is an electrical schematic diagram of a preferred embodiment of the present invention.

FIG. 2 illustrates a plurality of graphs of specific waveform signals occurring with the preferred embodiment of FIG. 1.

DESCRIPTION OF THE PREFERRED EMBODIMENT

Referring to FIG. 1, the preferred embodiment may be used in connection with a conventional internal combustion engine ignition system 11 having a 12-volt battery 13 and a conventional switch 15 which provides current to a primary coil 17. Ignition signals are generated in coil 17 by means of a conventional condensor 19 and a set of mechanical breaker points 21a, 21b which are opened and closed in synchronism with the engine by a cam 23. Points 21a, 21b form an ignition switch.

The ignition signals generated by primary coil 17 induce a large voltage in a secondary coil 25 which is transmitted to a conventional distributor 27. Distributor 27 transmits the high energy secondary ignition signals to spark plugs of the combustion engine in a well-known manner. The ignition system also could comprise a more modern system in which semi-conductor electronic components perform the switching function accomplished by points 21a, 21b.

The preferred embodiment is connectable to ignition system 11 by a pair of leads 29, 31 securable to primary coil 17 and ground, respectively. A third lead 33 is connectable to the positive terminal of battery 13 to provide a reference voltage source to the preferred circuitry, as described hereinafter. The ignition signals from primary coil 17 are fed along lead 29 through a shaping circuitry 35 for application to a comparator switching circuit 37. Shaping circuitry 35 receives ignition signals via resistor 39, and the signals are negative-peak clipped by a diode 41, and thereafter attenuated and filtered by resistor 43, capacitor 45 and resistor 47. The shaping circuit 35 filters any high frequency ripple signals developed along line 29.

The filtered ignition signal is applied to the inverting input of a conventional comparator amplifier 49 of switching circuitry 37, for reference against a voltage level formed by resistors 51, 53 which sample the battery voltage of engine battery 13 along lead 33. Resistors 51, 53 are selected in value so that the dwell section of the filtered ignition signal can be defined as a suitable filtered voltage below a percentage of battery voltage, as for example a percentage of 25% to 90%. This percentage of battery voltage can be set higher or lower according to the selection of resistors 51, 53.

Amplifier 49 can be constructed as an integrated circuit comparator, or an operational amplifier of the required characteristics, or an amplifier built using discrete components such as resistors, diodes, transistors, field effect devices and other devices, for determining the presence of a voltage below a selected fraction of a reference voltage. As is understood, the reference voltage from the vehicle battery 13 will vary moderately due to the battery's state of charge, the cranking of the engine, and the like.

Amplifier 49 produces a single continuous output voltage level to circuit node 55 during the time that the voltage signal at the inverting input of amplifier 49 is less than the voltage signal at its non-inverting input. The signal voltage output of amplifier 49 is continuously maintained until the filtered signal at the inverting input increases above the referenced voltage.

The use of mechanical breaker points 21a, 21b effectively grounds lead 29 during point closure which will drop the filtered signal to ground, whereas some of the more modern semi-conductor ignition systems permit the points-closed voltage to rise to a few volts above ground. Since the voltage developed across lead 29 can take on a range of voltages and still produce a switching by comparator 49, the preferred embodiment can be utilized in testing the dwell on both mechanical and semiconductor ignition systems.

The comparator switching circuitry 37 thus provides a voltage output to node 55 for a time representative of the time that the points 21a, 21b are closed. Therefore, the extent of time that amplifier 49 produces a voltage output is related to the dwell time being measured, i.e., the time of point closure.

A current producing circuit 57 develops a constant current output feeding node 55 along line 61. When the system is in its dwell state the output of amplifier 49 goes "high" producing a voltage output, causing a current $I_1$ to flow through a diode 59 due to the constant current fed to node 55 from circuitry 57. When the system is not in its dwell state, the output of amplifier 49 goes "low" pulling junction node 55 to such a low voltage that current from circuitry 57 flows into amplifier 49 and no appreciable current $I_1$ flows through diode 59.

Thus, the current along line 61 is formed independent of the ignition signal, but is directed through diode 59 in relation to the waveform of the ignition signal. The current $I_1$ is, therefore, magnitude independent of the ignition signal but generated in time relation to the dwell section of the ignition signal.

Circuitry 57 includes a pair of resistors 63, 65 connected in parallel across respective ends of which 7.5 volts and 5.6 volts are placed for developing a current through resistor 65. Current is tapped from resistor 65 passing through a resistor 67 and into node 55. Resistor 65 is a variable potentiometer permitting variation of the current fed to node 55 and thus variation of the current $I_1$.

Current flowing through diode 59 enters an angular calibration circuit 69 for developing a current output to a meter device 71, to provide a visual display of the dwell angle of the engine being tested. Calibration circuit 69 permits proper angular calibration of the meter device in order to gauge the dwell of different automotive engines, as for example, engines with different numbers of cylinders such as 4, 6 and 8 cylinders. An 8 cylinder engine will have a 100% dwell reading of 45° while 6 and 4 cylinder engines will have respective 100% dwell readings of 60° and 90°.

The current through diode 59 may take one of three separate paths upon entering calibration circuitry 69 according to the position of a selector switch 73. Selector switch 73 controls the path of current flow through or around resistor 75 and/or resistor 77 for providing a selectable signal output to meter device 71.

When selector switch 73 is positioned at switch point 79a, current flows through neither of resistors 75, 77 providing the largest current output. With selector switch 73 positioned at switch point 79b, current flows through resistors 75, 77 in parallel, providing a second current output; and with selector switch 73 positioned at switch point 79c, current flows solely through resistor 75 providing the lowest current output. Other resistor configurations may suggest themselves to persons skilled in the art for selectively passing different values of the current $I_1$.

Current $I_1$ enters calibration circuitry 69 and develops a current through metering device 71 along lead 80. The current $I_1$ delivered through diode 59 during each dwell cycle causes deflection of the needle of the meter to an angular meter reading dependent on the dwell time. As the dwell time changes, the angular position of the needle on the meter scale changes accordingly.

The current $I_1$ is fed to capacitor 81 connected in parallel with a pair of series connected resistors 83, 85. Meter 71 is connected in parallel with resistor 85 via lead 80. Capacitor 81 is a relatively large capacitor and is charged during the dwell periods, discharges during non-dwell periods, and serves to stabilize the needle of the meter. Capacitor 81 prevents the needle of meter 71 from rapidly returning to zero between each dwell period.

Referring to FIG. 2, Graph A illustrates the primary ignition signal generated by the ignition system 11. Graph B illustrates the output signal waveform of shaping circuit 35, which is applied to the inverting input of amplifier 49. Amplifier 49 compares the signal waveform of Graph B against the reference voltage applied at its non-inverting input. Whenever the signal waveform of Graph B drops below the reference voltage level, amplifier 49 produces a constant signal output as shown in Graph C. The output of Graph C in turn determines the current $I_1$ output of circuitry 37, as shown in Graph D.

The width of the output pulses of the current signal of Graph D represents the length of the dwell time. The pulse width of current $I_1$ determines the length of time in which current drives meter 71 and thus determines the extent of angular deflection of the meter needle.

Because a constant current $I_1$, is utilized to transduce the dwell time to a meter reading, an important feature of the invention is provided wherein a sole potentiometer 65 may be utilized to calibrate all three ranges of dwell selectable by switch 73. This saves not only the expense of purchasing two extra potentiometers for calibrating 3 ranges, but also saves labor cost in setting the potentiometers.

The component values of the circuitry of FIG. 1 are given as follows:
the resistor values are in ohms:

| | |
|---|---|
| resistor 39 | 3.3 K, ¼ W |
| diode 41 | 400 v |
| resistor 43 | 3.3 K, ¼ W |
| capacitor 45 | 0.1 micro-farads |
| resistor 47 | 3.3 K, ¼ W |
| amplifier 49 | UI ¼ LM 339 |
| resistor 51 | 330 ohms, ¼ W |
| resistor 53 | 1 K, ¼ W |
| diode 59 | 1 N 914 B |
| resistor 63 | 1 K, ¼ W |

| | |
|---|---|
| resistor 65 | 1 K, ¼ W |
| resistor 65 | potentiometer, 470 ohms |
| resistor 67 | 10 K, ¼ W |
| meter 71 | 500 micro amps, 150 ohms |
| resistor 75 | 12 K, ¼ W in parallel with 150 K, ¼ W |
| resistor 77 | 12 K, ¼ W |
| capacitor 81 | 100 micro-farads, 16 v |
| resistor 83 | 1 k, ¼ W |
| resistor 85 | 1.6 K, ¼ W |

It should be understood, of course, that the foregoing disclosure relates to a preferred embodiment of the invention and that other modifications or alterations may be made therein without departing from the spirit or the scope of the invention as set forth in the appended claims.

What is claimed is:

1. Apparatus for measuring the dwell time of an engine ignition system employing an ignition switch which periodically opens and closes in synchronism with the engine, said ignition switch generating an ignition signal, said apparatus comprising:

shaping means for shaping the ignition signal to form an output voltage level;

first means for producing a reference voltage;

second means for comparing the magnitude of said output voltage level to the magnitude of said reference voltage level, said second means generating a current signal of a substantially constant magnitude responsive to the relative magnitudes of said output voltage level and said reference voltage level for producing said current signal for a time representative of the time that the ignition switch is closed, said second means including drive means for selectively changing the constant magnitude of said current signal to another constant magnitude, and said second means including:

(i) comparator means for producing a first voltage level responsive to the magnitude of said output voltage level exceeding the magnitude of said reference voltage level and for producing a second voltage level responsive to the magnitude of said output voltage level being less than the magnitude of said reference voltage level; and (ii) current producing means for producing said current signal responsive to the production of said second voltage level, said current producing means being selectably variable for predetermining the magnitude of said current signal, said current producing means continuously generating current, and said comparator means directing said current for generating said current signal; and a visual display device connected to said second means and responsive to said current signal for producing a representative visual display of the time of generation of said current signal, whereby said visual display device provides a measurement of the dwell time of the engine ignition system.

2. Apparatus for measuring the dwell time of an engine ignition system employing an ignition switch which periodically opens and closes in synchronism with the engine, said ignition switch generating an ignition signal, said apparatus comprising:

shaping means for shaping the ignition signal to form an output voltage level;

first means for producing a reference voltage level;

second means for comparing the magnitude of said output voltage level to the magnitude of said reference voltage level, said second means generating a current signal of a substantially constant magnitude responsive to the relative magnitudes of said output voltage level and said reference voltage level for producing said current signal for a time representative of the time that the ignition switch is closed, said second means including drive means for selectively changing the constant magnitude of said current signal to another contant magnitude, said second means including:

(i) comparator means for producing a first voltage level responsive to the magnitude of said output voltage level exceeding the magnitude of said reference voltage level and for producing a second voltage level responsive to said output voltage level being less than the magnitude of said reference voltage level; and current producing means for producing said current signal responsive to production of said second voltage level; and said second means including a diode having an input node; said current producing means being connected to said input node for feeding a current to said node; and said comparator means being connected to said input node for feeding said first voltage level and said second voltage level to said node, said second voltage level being of a constant voltage magnitude for producing said current signal through said diode and said first output voltage level being of a relatively low voltage level for producing a negligible current through said diode; and a visual display device connected to said second means and responsive to said current signal for producing a representative visual display of the time of generation of said current signal, whereby said visual display device provides a measurement of the dwell time of the engine ignition system.

* * * * *